(12) United States Patent
Majhi et al.

(10) Patent No.: US 11,171,176 B2
(45) Date of Patent: Nov. 9, 2021

(54) ASYMMETRIC SELECTOR ELEMENT FOR LOW VOLTAGE BIPOLAR MEMORY DEVICES

(71) Applicant: Intel Corporation, Santa Clara, CA (US)

(72) Inventors: Prashant Majhi, San Jose, CA (US); Abhishek A. Sharma, Hillsboro, OR (US); Elijah V. Karpov, Portland, OR (US); Ravi Pillarisetty, Portland, OR (US); Brian S. Doyle, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 42 days.

(21) Appl. No.: 16/634,109

(22) PCT Filed: Sep. 27, 2017

(86) PCT No.: PCT/US2017/053848
§ 371 (c)(1),
(2) Date: Jan. 24, 2020

(87) PCT Pub. No.: WO2019/066826
PCT Pub. Date: Apr. 4, 2019

(65) Prior Publication Data
US 2020/0212105 A1 Jul. 2, 2020

(51) Int. Cl.
*H01L 27/24* (2006.01)
*H01L 27/22* (2006.01)
*H01L 45/00* (2006.01)

(52) U.S. Cl.
CPC ........ *H01L 27/2409* (2013.01); *H01L 27/224* (2013.01); *H01L 27/2481* (2013.01)

(58) Field of Classification Search
CPC ............... H01L 27/2409; H01L 27/224; H01L 27/2481; H01L 43/12; H01L 45/06; H01L 45/1233; H01L 45/144; H01L 45/1675
See application file for complete search history.

(56) References Cited

U.S. PATENT DOCUMENTS

| 2011/0310655 A1 | 12/2011 | Kreupl et al. |
| 2013/0003437 A1 | 1/2013 | Siau |

(Continued)

FOREIGN PATENT DOCUMENTS

WO WO-2017-052565 3/2017

OTHER PUBLICATIONS

International Preliminary Report on Patentability for International Patent Application No. PCT/US2017/053848, dated Apr. 9, 2020, 10 pgs.

(Continued)

*Primary Examiner* — David Vu
(74) *Attorney, Agent, or Firm* — Schwabe, Williamson & Wyatt, P.C.

(57) ABSTRACT

Embedded non-volatile memory structures having asymmetric selector elements are described. In an example, a memory device includes a word line. An asymmetric selector element is above the word line. The asymmetric selector element includes a first electrode material layer, a selector material layer on the first electrode material layer, and a second electrode material layer on the selector material layer, the second electrode material layer different in composition than the first electrode material layer. A bipolar memory element is above the word line, the bipolar memory element on the asymmetric selector element. A bit line is above the word line.

17 Claims, 10 Drawing Sheets

(56) References Cited

U.S. PATENT DOCUMENTS

2014/0209892 A1  7/2014  Kuo et al.
2016/0111471 A1  4/2016  Mathur et al.
2019/0006415 A1* 1/2019  Li ........................... H01L 43/08

OTHER PUBLICATIONS

International Search Report and Written Opinion for International Patent Application No. PCT/US2017/053848 dated Feb. 23, 2018, 14 pgs.

* cited by examiner

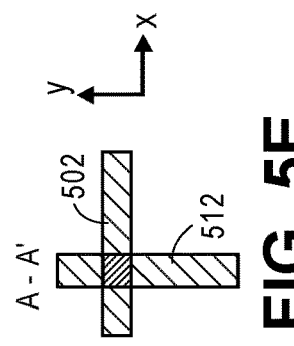
FIG. 5E
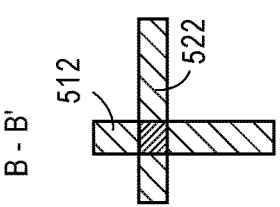
FIG. 5F
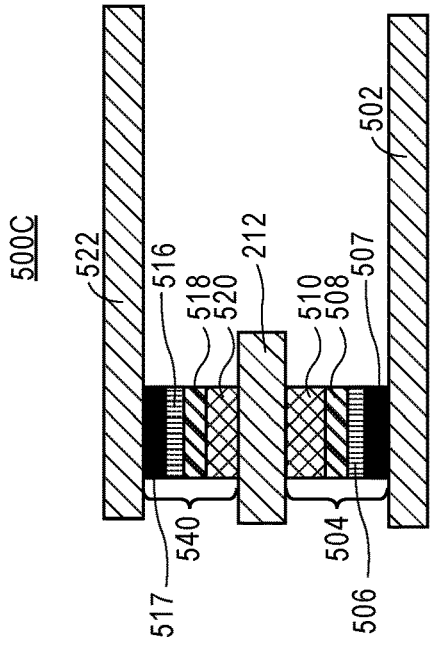
FIG. 5C
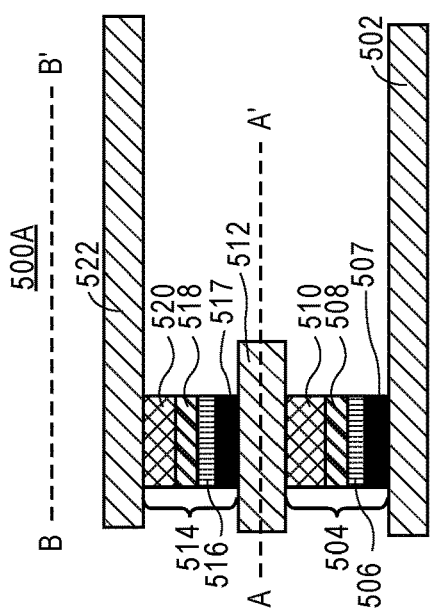
FIG. 5A
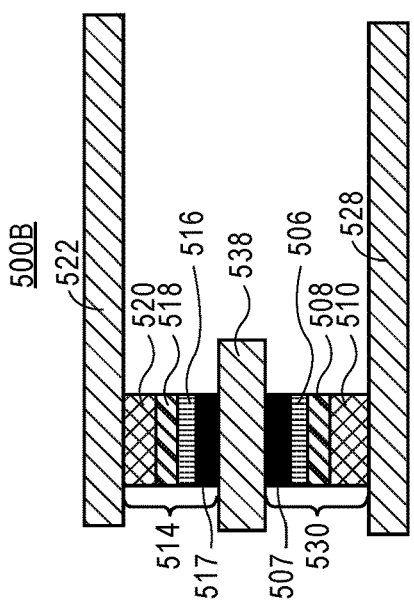
FIG. 5D
FIG. 5B

ASYMMETRIC SELECTOR ELEMENT FOR LOW VOLTAGE BIPOLAR MEMORY DEVICES

CROSS-REFERENCE TO RELATED APPLICATION

This patent application is a U.S. National Phase Application under 35 U.S.C. § 371 of International Application No. PCT/US2017/053848, filed Sep. 27, 2017, entitled "ASYMMETRIC SELECTOR ELEMENT FOR LOW VOLTAGE BIPOLAR MEMORY DEVICES," which designates the United States of America, the entire disclosure of which is hereby incorporated by reference in its entirety and for all purposes.

TECHNICAL FIELD

Embodiments of the disclosure are in the field of integrated circuit structures and, in particular, asymmetric selector elements for low voltage bipolar memory devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased functionality. The drive for ever-more functionality, however, is not without issue. It has become increasingly significant to rely heavily on innovative fabrication techniques to meet the exceedingly tight tolerance requirements imposed by scaling.

Embedded memory with non-volatile memory devices, e.g., on-chip embedded memory with non-volatility can enable energy and computational efficiency. A non-volatile memory device such as magnetic tunnel junction (MTJ) memory device or resistive random access memory (RRAM) device is coupled with selector element to form a memory cell. A large collection of memory cells forms a key component of non-volatile embedded memory. However, with scaling of memory devices, the technical challenges of assembling a vast number of memory cells presents formidable roadblocks to commercialization of this technology today.

BRIEF DESCRIPTION OF THE DRAWINGS

FIG. 5A illustrates a cross-sectional view of stacked memory cells that share a common word line, in accordance with an embodiment of the present disclosure.

FIG. 5B illustrates a cross-sectional view of stacked memory cells where a first asymmetric selector element of a first memory cell shares a common word line with a second asymmetric selector element of a second memory cell, in accordance with an embodiment of the present disclosure.

FIG. 5C illustrates a cross-sectional view of stacked memory cells where a first memory element of a first memory cell shares a common word line with a second memory element of a second memory cell, in accordance with an embodiment of the present disclosure.

FIG. 5D illustrates a cross-sectional view of stacked memory cells that share a common word line, in accordance with an embodiment of the present disclosure.

FIG. 5E illustrates a plan view of the memory cell along the direction A-A' in FIG. 5A.

FIG. 5F illustrates a plan view of the memory cell, along the direction B-B' in FIG. 5A.

FIG. 6A illustrates a word line formed in an opening in a dielectric layer formed above a substrate.

FIG. 6B illustrates the structure of FIG. 6A following the formation of a selector material layer stack including a first electrode material layer and a selector material layer, a second electrode layer and a bipolar memory material layer stack.

FIG. 6C illustrates the structure of FIG. 6B following the patterning of the bipolar memory material layer stack and the second electrode material layer.

FIG. 6D illustrates the structure of FIG. 6C following the patterning of the selector material layer stack.

FIG. 6E illustrates the structure of FIG. 6D following the formation of a second dielectric layer on the word line and on the dielectric layer and on the active memory device.

FIG. 6F illustrates a bit line formed on the uppermost surface of the memory element and on the uppermost surface of the second dielectric layer to complete formation of a memory cell.

DESCRIPTION OF THE EMBODIMENTS

Figure 1:
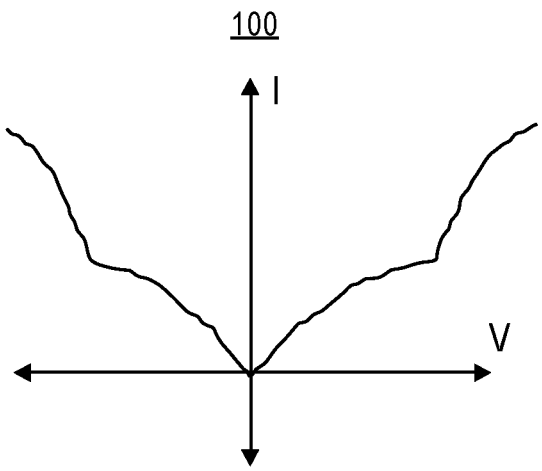
FIG. 1 is an I-V plot of a symmetric selector element exhibiting snap-less behavior.

Asymmetric selector elements for low voltage bipolar memory devices are described. In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to asymmetric selector elements for non-volatile memory devices. Embodiments may pertain to or include three-dimensional (3D) cross-point arrays, embedded non-volatile memory (eNVM), and selectors for eNVM. Approaches described herein may be implemented to realize high performance highly scaled eNVM cells, and potentially increase monolithic integration of eNVM in system-on-chips (SoCs) of future technology nodes. Approaches may be implemented to fabricate a high density and high performance cross-point memory cell, increasing the potential of using scaled resistive memory cells for future eNVM applications.

To provide context, non-volatile memory devices such as a magnetic tunnel junction (MTJ) memory device or a resistive random access memory (RRAM) device depend on a phenomenon of resistance switching to store information. The non-volatile memory device functions as a variable resistor where the resistance of the device may switch between a high resistance state and a low resistance state. A non-volatile memory device may be coupled with a selector element to form a memory cell. The selector may be a volatile switching element that is placed in series with the non-volatile memory device. A large collection of such memory cells forms a key component of non-volatile embedded memory. Operating a memory cell including a selector and a non-volatile memory element may require sufficiently low threshold selector turn-on voltages (e.g. less than or equal to 1V) in order to minimize power consumption.

In accordance with one or more embodiments of the present disclosure, an asymmetric selector element is used together with a memory element. The asymmetric selector element includes a first electrode material layer, a selector material layer on the first electrode material layer, and a second electrode material layer on the selector material layer, the second electrode material layer different in composition than the first electrode material layer. In an embodiment, a bipolar memory element is coupled to the asymmetric selector element. In an embodiment, the bipolar memory element includes a non-volatile memory device such as a magnetic tunnel junction (MTJ) memory device or a resistive random access memory (RRAM) device. The bipolar memory element may be designed to operate at sufficiently low voltages such as 1V or less. In an embodiment, the total voltage requirement for operation of the memory cell including the asymmetric selector element and the non-volatile memory element is less than 2V. The memory cell further includes a bit line disposed above the asymmetric selector element. In an embodiment, a large collection of memory cells each including a asymmetric selector element and a bipolar memory element are utilized to form a non-volatile memory array. The non-volatile memory array formed by a memory cell at each intersection of a word line and a bit line is, herein, referred to as a non-volatile cross-point memory array. A non-volatile cross-point memory array can offer significant advantages for scaling to achieve high density memory.

In accordance with one or more embodiments of the present disclosure, high density 4F2 embedded memory based on an asymmetric selector (1S)/one resistor (1R) cell cross-point structures is described. It is to be appreciated that for state-of-the-art one selector/one resistor (1S1R) structures, it may be very challenging to find an appropriate selector with device characteristics suitable to integrate with, e.g., an RRAM memory to avoid read/write disturbs. By contrast, in an embodiment, integration of an asymmetric selector is described, where the integrated asymmetric selector characteristics become compatible with, e.g., an RRAM memory, to avoid program/erase disturbs and improve functionality and yield.

To demonstrate concepts described herein, challenges with state-of-the-art 1S1R stacks involving symmetric selectors are described below in association with FIGS. 1 and 2. As a first example of a state-of-the-art selector behavior, FIG. 1 is an I-V plot 100 of a symmetric selector element exhibiting snap-less behavior. In the example of plot 100, a symmetric selector stack has like materials as electrode material layers on both sides of a selector material. Plot 100 demonstrates snap-less behavior for the symmetric selector stack. Such snap-less behavior typically requires high voltages for 1S1R operation, which is a challenge for implementation in eNVM.

Figure 2:
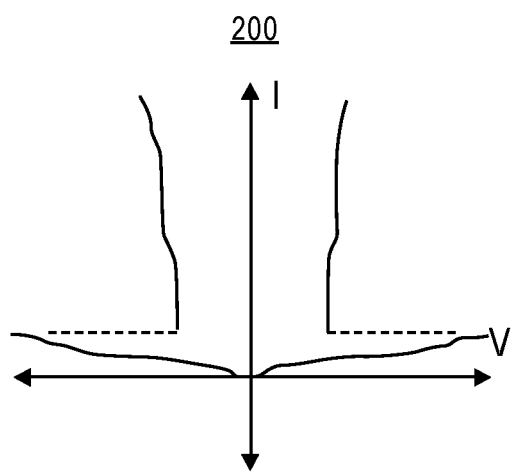
FIG. 2 is an I-V plot of a symmetric selector element exhibiting snap-back behavior.

As a second example of a state-of-the-art selector behavior, FIG. 2 is an I-V plot 200 a symmetric selector element exhibiting snap-back behavior. In the example of plot 200, a symmetric selector stack has like materials as electrode material layers on both sides of a selector material. Plot 200 demonstrates snap-back behavior for the symmetric selector stack. Such snap-back behavior typically has associated issues with margin and disturb, and may be associated with related parasitic discharge during a SET function.

Figure 3A:
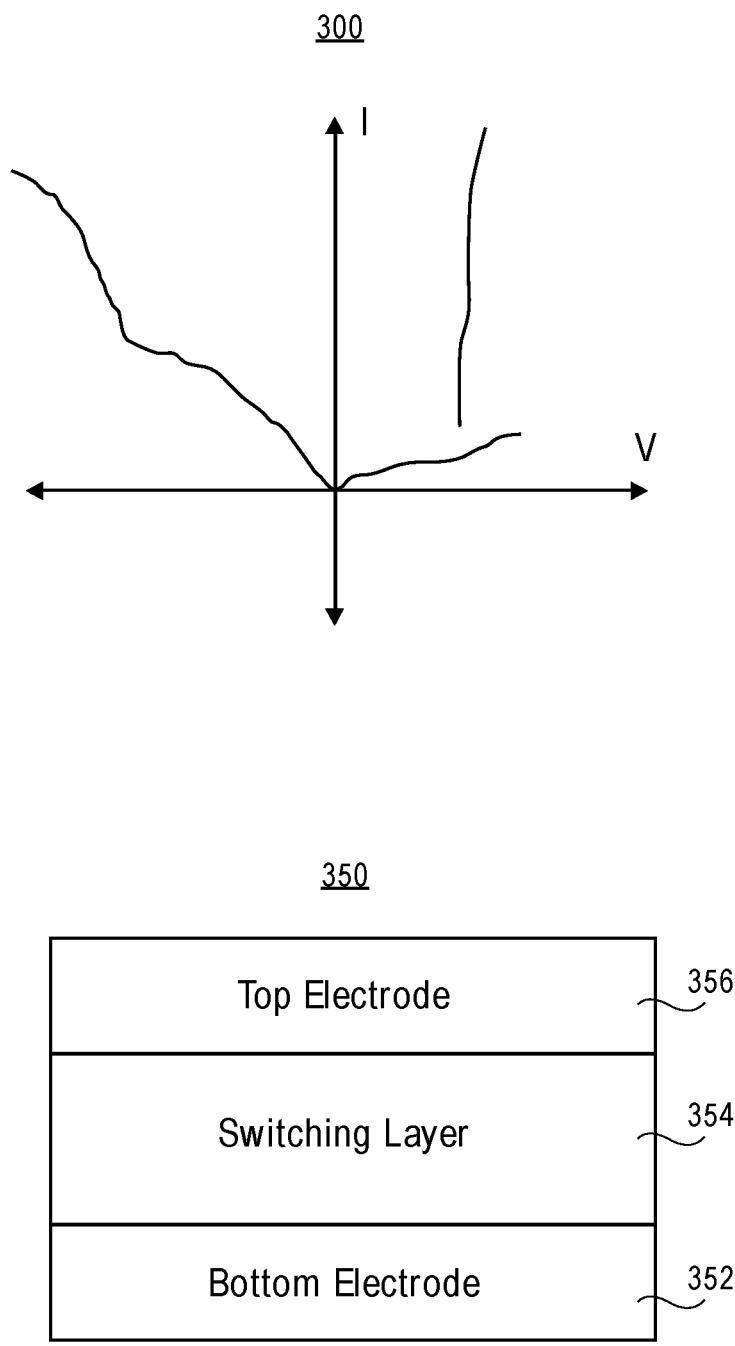
FIG. 3A includes an I-V plot and corresponding cross-sectional view of an asymmetric selector element, in accordance with an embodiment of the present disclosure.

In accordance with an embodiment of the present disclosure, an asymmetric selector is integrated with non-volatile memory, such as RRAM, in a 1S1R cross-point array. Such an arrangement may exploit advantages of the asymmetric selector to improve memory cell operation and yield. FIG. 3A includes an I-V plot 300 and corresponding cross-sectional view of an asymmetric selector element 350, in accordance with an embodiment of the present disclosure. Asymmetric selector element 350 includes a switching layer 354. The switching layer 354 is on a bottom electrode material layer 352. A top electrode material layer 356 is on the switching layer 354. In an embodiment, the top electrode material layer 356 differs in composition from the bottom electrode material layer 352. Plot 350 demonstrates asymmetric switching behavior for the stack 350.

Figure 3B:
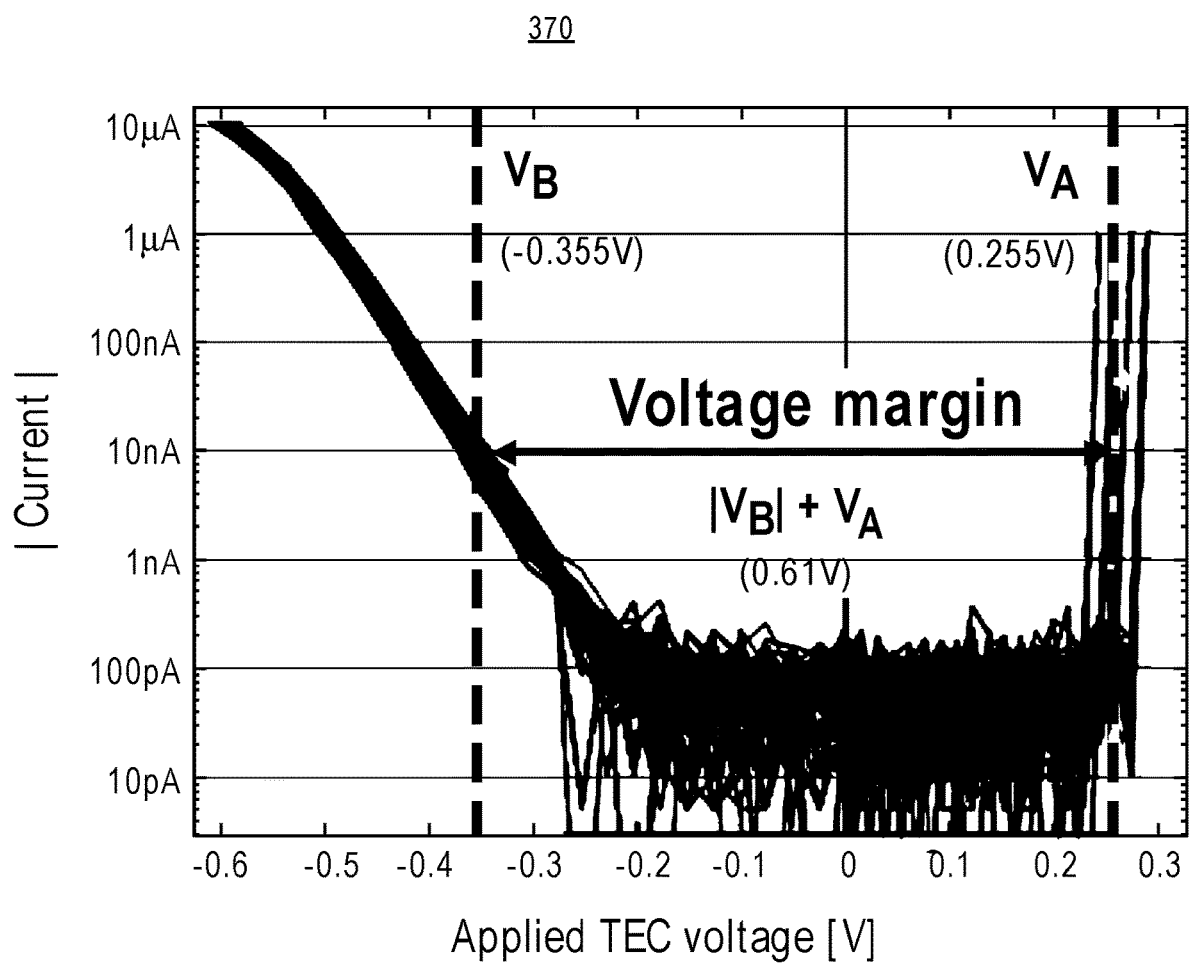
FIG. 3B is a plot showing voltage margin for the asymmetric selector element of FIG. 3A, in accordance with an embodiment of the present disclosure.

FIG. 3B is a plot showing voltage margin for the asymmetric selector element of FIG. 3A, in accordance with an embodiment of the present disclosure. In an embodiment, the asymmetricity of the selector stack 350 complements the characteristics of the switching material layer 354 to result in a high density, high performance, high yield memory array. Significant advantage for unipolar RRAM (read negative, write positive) may be realized. Further, embodiments maybe applicable for bipolar devices by using snap-back polarity for RESET and snap-less polarity for SET. For example, advantages may include one or more of (1) a controlled SET (LRS) with good ballast, (2) low voltage and high current for high yield RESET, or (3) read in snap-less polarity for good read margin.

Referring to FIGS. 3A and 3B, in an embodiment, for unipolar RRAM, the programming of the RRAM can be performed in one polarity, but the read can be performed in reverse polarity to avoid read disturb. In an embodiment, for bipolar RRAM, snap-back polarity can be used for RESET and snap-less polarity for SET, leading to high currents and low voltage for high yielding memory arrays. In an embodiment, for RRAM prone to parasitic damage, the snap-less polarity can be used for controlled SET (HRS-to-LRS) with good ballast. Such characteristics for an engineered 1S1R cell may provide the opportunity to integrate higher density arrays with high yield (e.g., due to the larger operation window, despite variability). Embodiments may be implemented to improve performance and reliability of cross-point RRAM memory cells. In an embodiment, an asymmetric selector plus RRAM structure provides a lower total voltage swing to operate the memory cell. In an embodiment, a relatively lower voltage is needed to reset the bit for asymmetric selector.

In an embodiment, asymmetric selector characteristics can be tuned by engineering the material stack. Also, various process routes can be adopted to integrate the 1S1R for high density cross-point arrays. It is to be appreciated that the feasibility may depend on the ability to engineer the individual selector characteristics that are asymmetric within a 1S1R structure. In one embodiment, individual selector characteristics can be tuned to provide targeted integrated selector and memory characteristics for 1S1R. As described below, various process routes or architectures can be implemented to integrate the asymmetric 1S+1R for high density cross-point arrays.

Figure 4C:
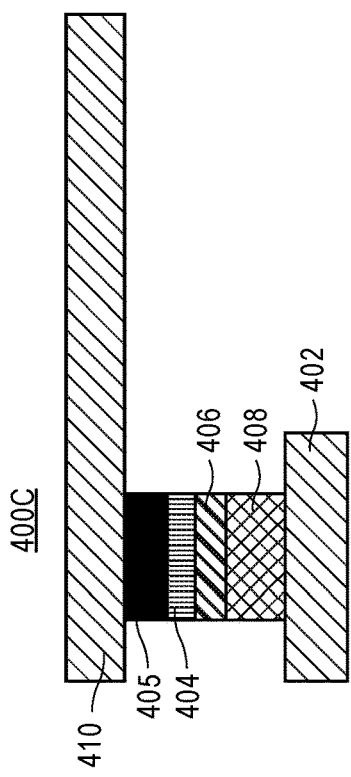
FIG. 4C illustrates a cross-sectional illustration of a memory cell, in accordance with an embodiment of the present disclosure.
Figure 4E:
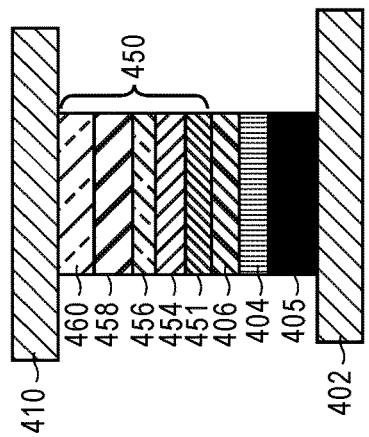
FIG. 4E illustrates a cross-sectional view of a memory cell that includes a bipolar memory element such as a magnetic tunnel junction (MTJ) memory device disposed above a conductive electrode, in accordance with an embodiment of the present disclosure.
Figure 4D:
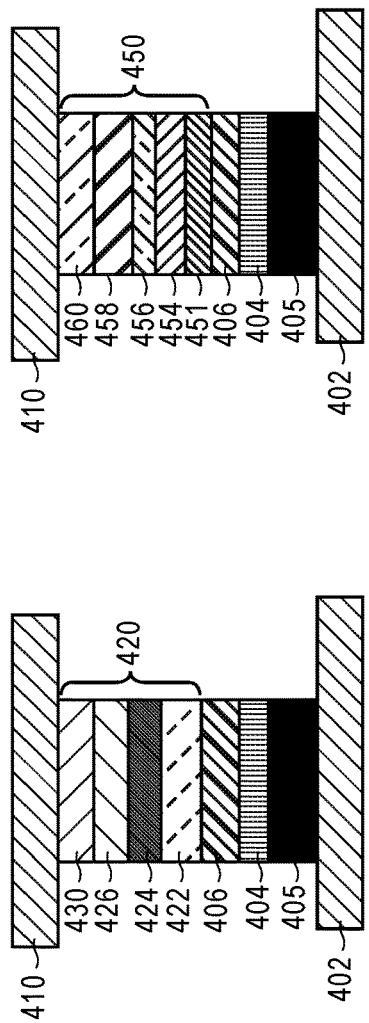
FIG. 4D illustrates a cross-sectional view of a memory cell that includes a bipolar memory element such as a resistive random access memory (RRAM) device disposed above the conductive electrode, in accordance with an embodiment of the present disclosure.
Figure 4A:
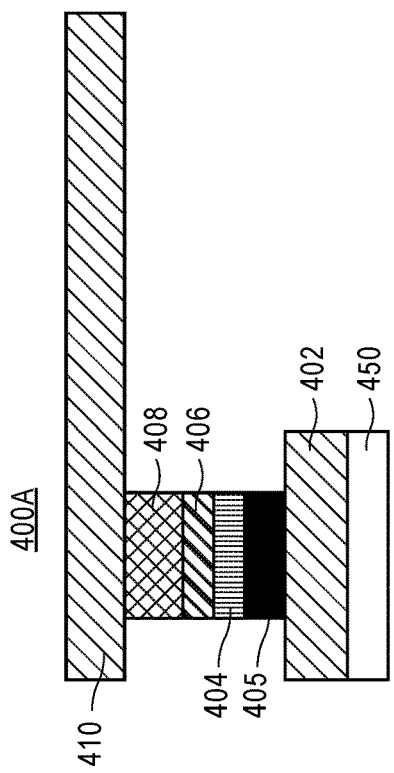
FIG. 4A illustrates a cross-sectional illustration of a memory cell disposed above a substrate, in accordance with an embodiment of the present disclosure.

In an exemplary implementation, FIG. 4A illustrates a cross-sectional illustration of a memory cell 400 disposed above a substrate 450. The memory cell 400 includes a word line 402 disposed above the substrate. In an embodiment, an asymmetric selector element is disposed above the word line. The asymmetric selector element includes a selector material layer 404 on a first electrode material layer 405. A second electrode material layer 406 is on the selector material layer 404. The second electrode material layer 406 differs in composition from the first electrode material layer 405. In an embodiment, a bipolar memory element 408 is disposed above the asymmetric selector element 406/404/405, and a bit line 410 is disposed above the bipolar memory element 408.

In an embodiment, one of the first electrode material layer 405 or the second electrode material layer 406 is composed of a single metal species. In an embodiment, the one of the first electrode material layer 405 or the second electrode material layer 406 is composed of a metal selected from the group consisting of tungsten (W), platinum (Pt), ruthenium (Ru), and iridium (Ir). In an embodiment, one of the first electrode material layer 405 or the second electrode material layer 406 has a thickness between 5 nanometers and 10 nanometers.

In an embodiment, the other of the first electrode material layer 405 or the second electrode material layer 406 is composed of an alloy of a transition metal species and a p-block species. In one embodiment, the transition metal species is copper, and the p-block species is tellurium (Te) or germanium (Ge). In an embodiment, the other of the first electrode material layer 405 or the second electrode material layer 406 includes copper telluride (CuTe) or copper germinide (CuGe). In an embodiment, the other of the first electrode material layer 405 or the second electrode material layer 406 has a thickness between 5 nanometers and 10 nanometers.

In an embodiment, the selector material layer 404 is an electrolyte layer, which may be referred to as a mixed ion layer. In an embodiment, the selector material layer 404 includes copper ions having a mixture of valencies (e.g., copper (I) or copper(II)). In one such embodiment, the selector material layer 404 further includes a group 6 element selected from the group consisting of Te, Se, and S.

In another embodiment, the selector material layer 404 includes a phase change material that exhibits at least two different states or extents of crystallinity. In an embodiment, the phase change material includes Ge and Te. In one such embodiment, the phase change material further includes Sb. In an embodiment, the phase change material includes a ternary alloy of Ge, Te and Sb such as Ge$_2$Sb$_2$Te$_5$. In an embodiment, the phase change material includes a binary alloy, ternary alloy or a quaternary alloy including at least one of Te, Se, or S. In an embodiment, the phase change material includes a binary alloy, ternary alloy or a quaternary alloy which includes at least one of Te, Se, or S, where said alloy further includes one element from the group V periodic table such as Sb. In an embodiment, the dopant concentration is between 5% and 20% of the total composition of the phase change material. In an embodiment, the phase change material exhibits at least two different states, amorphous and crystalline with marked differences in electrical resistance. In an embodiment, the phase change material is in an amorphous state for application as a volatile selector element. In an embodiment, the selector element 104 has a thickness between 20 nanometers-60 nanometers.

In another embodiment, the selector material layer 404 includes an insulator metal transition material layer selected from the group consisting of a vanadium oxide material and a niobium oxide material. In an embodiment, the insulator metal transition material layer is a single crystalline material. In another embodiment, the insulator metal transition material layer is an amorphous or a polycrystalline material.

In another embodiment, the selector material layer 404 includes a semiconducting oxide material layer such as, but not limited to, indium gallium zirconium oxide (IGZO), tin oxide, antimony oxide, indium oxide, indium tin oxide, titanium oxide, zinc oxide, indium zinc oxide, gallium oxide, titanium oxynitride, ruthenium oxide, or tungsten oxide. In one embodiment, an IGZO layer is used and has a gallium to indium ratio of 1:1, a gallium to indium ratio greater than 1 (e.g., 2:1, 3:1, 4:1, 5:1, 6:1, 7:1, 8:1, 9:1, or 10:1), or a gallium to indium ratio less than 1 (e.g., 1:2, 1:3, 1:4, 1:5, 1:6, 1:7, 1:8, 1:9, or 1:10). A low indium content IGZO may refer to IGZO having more gallium than indium (e.g., with a gallium to indium ratio greater than 1:1), and may also be referred to as high gallium content IGZO. Similarly, low gallium content IGZO may refer to IGZO having more indium than gallium (e.g., with a gallium to indium ratio less than 1:1), and may also be referred to as high indium content IGZO.

In an embodiment, the memory device 408 includes a magnetic tunnel junction (MTJ) memory device as will be described in greater detail below in association with FIG. 4D. In an embodiment, the memory device 408 includes a resistive random access memory (RRAM) device as will be described in greater detail below in association with FIG. 4E.

Figure 4B:
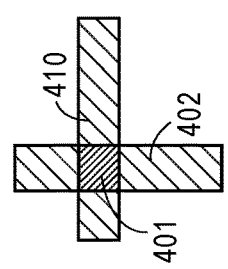
FIG. 4B illustrates a plan view of the memory cell of FIG. 4A.

FIG. 4B illustrates a plan view of the memory cell 400. In an embodiment, the word line 402 and the bit line 410 are arranged in an orthogonal manner. An outline 401 of the asymmetric selector element 406/404/405 and bipolar memory element 408, relative to the bit line 410 and the word line 102 is also illustrated in FIG. 4B. In an embodiment, the asymmetric selector element 406/404/405 and the bipolar memory element 408 are spatially confined to an intersection between the word line 402 and the bit line 408, which may be referred to as a cross point memory cell.

FIG. 4C illustrates a cross-sectional illustration of a memory cell 400C where the bipolar memory element 408 is disposed on the word line 402, and an asymmetric selector element 406/404/405 is disposed on the bipolar memory element 408.

FIG. 4D illustrates a cross-sectional view of a memory cell 400D that includes a bipolar memory element such as a resistive random access memory (RRAM) device 420 disposed above an asymmetric selector element 406/404/405. In an embodiment, the RRAM device 420 includes a bottom electrode 422, a switching layer 424 including a metal oxide disposed on the bottom electrode 422, an oxygen exchange layer 426 disposed on the switching layer 424, and a top electrode 430 disposed on the oxygen exchange layer 426.

FIG. 4E illustrates a cross-sectional view of a memory cell 400E that includes a bipolar memory element such as a magnetic tunnel junction (MTJ) memory device 450 disposed above an asymmetric selector element 406/404/405. In an embodiment, the MTJ device 450 includes a bottom electrode 451 disposed above the conductive electrode 406, a fixed magnet 454 disposed above the bottom electrode 451, a tunnel barrier 456 such as an MgO layer disposed on the fixed magnet 454, a free magnet 458 disposed on the tunnel barrier 456, and a top electrode 460 disposed on the free magnet 458.

In another example, FIG. 5A illustrates a cross-sectional view of stacked memory cells 500 that shares a common word line. In an embodiment, the stacked memory cells include a first bit line 502, and a memory cell 504 on the first bit line 502. In an embodiment, the first memory cell 504 includes a first asymmetric selector element 508/506/507 on the first bit line 502 and a first bipolar memory element 510 disposed on the first asymmetric selector element 508/506/507. A word line 512 is disposed on the first memory cell 504.

In an embodiment, a second memory cell 514 is disposed on the word line 512. In an embodiment, the second memory cell 514 includes a second asymmetric selector element 518/516/517 disposed on the word line, and a second bipolar memory element 520 disposed on the second asymmetric selector element 518/516/517. A second bit line 522 is disposed on the second memory cell 514.

In an embodiment, the first memory device 510 includes a magnetic tunnel junction (MTJ) memory device as described in association with FIG. 4D. In an embodiment, the memory device 510 includes a resistive random access memory (RRAM) device as described in association with FIG. 4E. In an embodiment, the second memory device 520 is substantially the same as the first memory device 510. In an embodiment, when the first memory device 510 includes a magnetic tunnel junction (MTJ) memory device, then the second memory device 520 also includes a magnetic tunnel junction (MTJ) memory device to ensure variation between the various memory cells are minimized during stacked memory cell operation. In an embodiment, when the first memory device 510 includes a resistive random access memory (RRAM) device, then the second memory device 520 also includes a resistive random access memory (RRAM) device.

FIG. 5B illustrates a cross-sectional view of a stacked memory cell 500B where a first asymmetric selector element 508/506/507 and second asymmetric selector element 518/516/517 share a common word line 538. In an embodiment, a first memory cell 530 includes a first bipolar memory element 510 disposed on the first bit line 502, and the first asymmetric selector element 508/506/507 disposed on the first bipolar memory element 510. The word line 538 is disposed on the first memory cell 530. In an embodiment, the second memory cell 514 is disposed on the word line 538. The second memory cell 514 includes the second asymmetric selector element 518/516/517.

FIG. 5C illustrates a cross-sectional view of stacked memory cells 500C where the first memory element 510 of the first memory cell 504, shares a common word line with the second memory element 520 of a second memory cell 540. In an embodiment, the first memory cell 504 is disposed on the first bit line 502. The word line 512 is disposed on the first memory cell 504.

In an embodiment, the second memory cell 540 includes the second memory element 520 disposed on the word line 512, and the second asymmetric selector element 518/516/517 disposed on the second conductive electrode 518.

FIG. 5D illustrates a cross-sectional view of a stacked memory cell 500D where the second memory cell 540 is disposed above the first memory cell 530. In an embodiment, word line 512 is disposed between the second memory cell 540 and the first memory cell 230.

FIG. 5E illustrates a plan view of the memory cell 500A along the direction A-A' in FIG. 5A. In an embodiment, the word line 512 and the first bit line 502 are arranged in an orthogonal manner. An outline of the first memory cell 504 relative to the first bit line 502 and the word line 512 is also illustrated in FIG. 5B. In an embodiment, the first memory cell 504 is spatially confined to an intersection between the word line 512 and the first bit line 502, which may be referred to as a first cross point memory cell.

FIG. 5F illustrates a plan view of the memory cell 500A, along the direction B-B' in FIG. 5A. In an embodiment, the word line 512 and the second bit line 522 are arranged in an orthogonal manner. An outline of the second memory cell 514 relative to the second bit line 522 and the word line 512 is also illustrated in FIG. 5B. In an embodiment, the second memory cell 504 is spatially confined to an intersection between the word line 512 and the second bit line 522, and may be referred to as a second cross point memory cell.

FIGS. 6A-6F illustrate cross-sectional views representing various operations in a method of fabricating a memory cell.

Figure 6A:
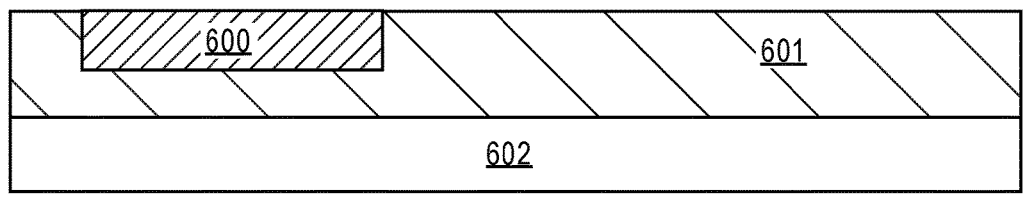
FIGS. 6A-6F illustrate cross-sectional views representing various operations in a method of fabricating a memory cell, where.

FIG. 6A illustrates a word line 600 formed in an opening in a dielectric layer 601 formed above a substrate 602.

In an embodiment, the substrate 602 includes a suitable semiconductor material such as but not limited to, single crystal silicon, polycrystalline silicon and silicon on insulator (SOI). In another embodiment, substrate 602 includes other semiconductor materials such as germanium, silicon germanium or a suitable group III-N or a group III-V compound.

In an embodiment, the word line 600 is formed in a dielectric layer 601 by a damascene or a dual damascene process that is well known in the art. In an embodiment, the word line 600 includes a barrier layer, such as titanium nitride, ruthenium, tantalum, tantalum nitride, and a fill metal, such as copper, tungsten. In another embodiment, the word line 600 includes a layer of a single material such as TiN or TaN. In an embodiment, the word line 600 is fabricated using a subtractive etch process when materials other than copper are utilized. In one such embodiment, the word line 600 includes a material such as but not limited to titanium nitride, ruthenium, tantalum, tantalum nitride. In an embodiment, the dielectric layer 601 includes a material such as but not limited to silicon dioxide, silicon nitride, silicon carbide, or carbon doped silicon oxide. In an embodiment, the dielectric layer 601 has an uppermost surface substantially co-planar with an uppermost surface of the word line 600. In an embodiment, the dielectric layer 601 has a total thickness between 70 nm-300 nm. In an embodiment, word line 600 is electrically connected to a circuit element such as an access transistor (not shown). Logic devices such as access transistors may be integrated with memory devices such as a MTJ device to form embedded memory.

Figure 6B:
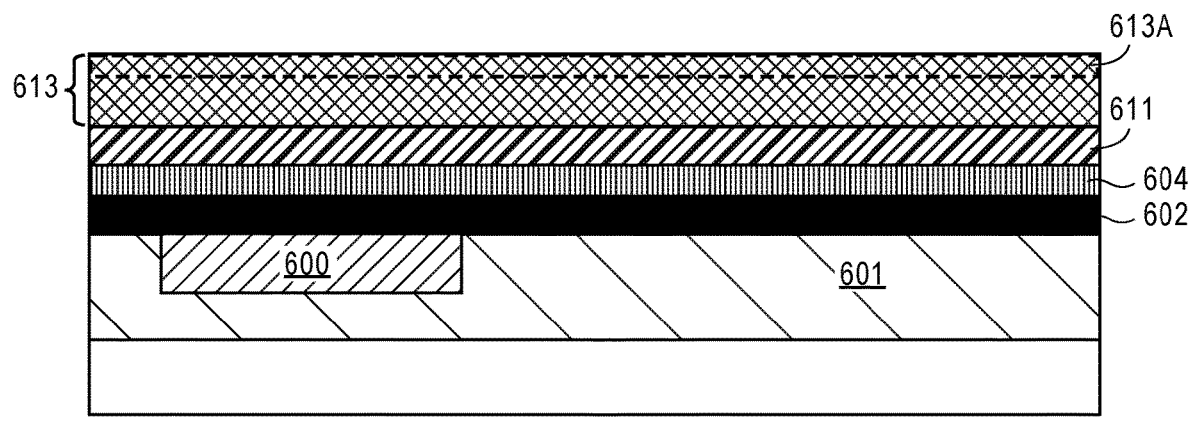

FIG. 6B illustrates the structure of FIG. 6A following the formation of a selector material stack on the word line. The selector material stack includes a first electrode material layer 602, and a selector material layer 604 on the first electrode material layer 602. A second electrode material layer 611 is formed on the selector material layer 604. A bipolar memory material layer stack 613 is formed on the conductive electrode layer 611.

In an embodiment, the selector material stack, including first electrode material layer 602 and the selector material layer 604 is blanket deposited on the word line 600 and on the dielectric layer 601. The second electrode material layer 611 may also be blanket deposited, as is depicted. The selector material layer 604 may be deposited using an evaporation process, an atomic layer deposition (ALD) process or a chemical vapor deposition (CVD) process. In an embodiment, the chemical vapor deposition process is enhanced by plasma techniques such as RF glow discharge (plasma enhanced CVD) to increase the density and uniformity of the film. In an embodiment, one or both of the first electrode material layer 602 and the second electrode material layer 611 is formed using physical vapor deposition (PVD) or using atomic layer deposition (ALD). In an embodiment, one or both of the first electrode material layer 602 and the second electrode material layer 611 is deposited to a thickness between 5 nm-10 nm.

In an embodiment, the memory material layer stack 613 is blanket deposited on the on the second electrode material layer 611. In an embodiment, the bipolar memory material layer stack 613 includes at least three or more layers to fabricate a magnetic tunnel junction (MTJ) memory element. In one embodiment, the bipolar memory material layer stack for an MTJ memory element is deposited using a PVD process. In another embodiment, the bipolar memory material layer stack 613 includes at least three or more layers to fabricate a resistive random access memory (RRAM) memory element. In one embodiment, the bipolar memory material layer stack for an RRAM memory element is deposited using a PVD process.

In an embodiment, an uppermost layer of memory material layer stack 613 includes an uppermost electrode layer 613A (contained within dashed lines) that ultimately acts as a hardmask for patterning the memory material layer stack 613 as well as the second electrode material layer 611. In an embodiment, the uppermost electrode layer has a thickness between 70 nm-100 nm.

In an embodiment, when the bipolar memory material layer stack 613 includes layers for an MTJ memory element the bipolar memory material layer stack 613 is subjected to an annealing process. In an embodiment, the annealing process is performed at a temperature between 300-400 degrees Celsius.

Figure 6C:
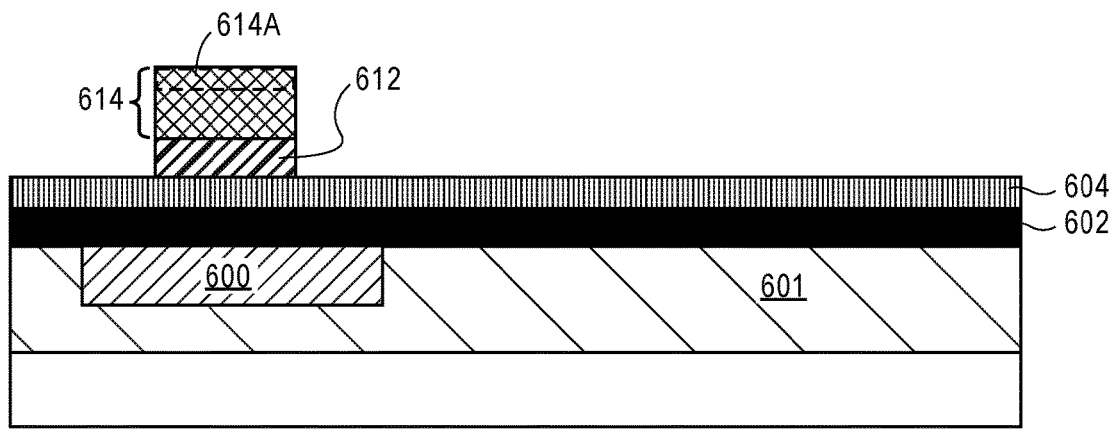

FIG. 6C illustrates the structure of FIG. 6B following the patterning of the bipolar memory material layer stack 613 and the second electrode material layer 611. In an embodiment, a photoresist mask is formed on an uppermost surface of the bipolar memory material layer stack 613. In an embodiment, the photoresist mask defines a location where a memory cell will be subsequently formed. In an embodiment, a plasma etch process is utilized to pattern the bipolar memory material layer stack 613 and the second electrode material layer 611 to form a memory element 614 and a top conductive electrode 612. In an embodiment, the plasma etch is used to etch the uppermost electrode 613A to form an uppermost electrode 614A.

Figure 6D:
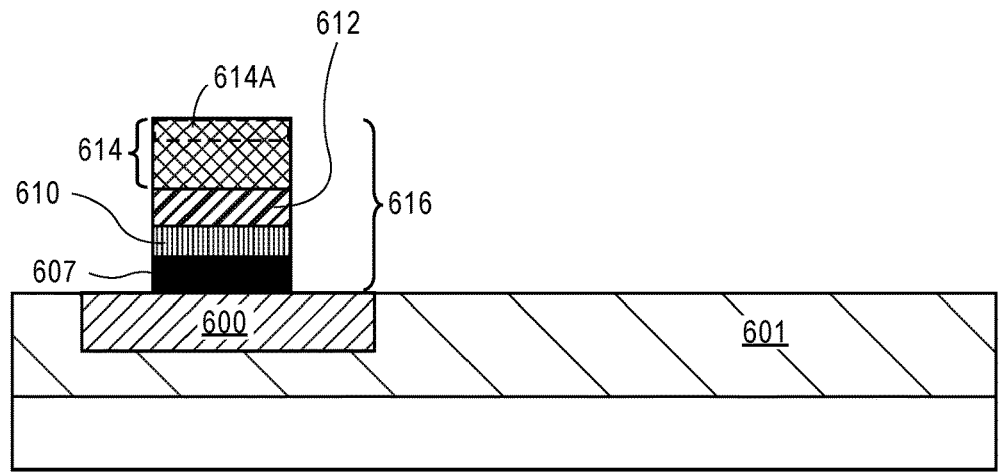

FIG. 6D illustrates the structure of FIG. 6C following the patterning of the selector material stack, including first electrode material layer 602 and the selector material layer 604, to form asymmetric selector layer 610 and bottom conductive electrode 607, respectively. In an embodiment, the combination of top electrode 612, asymmetric selector layer 610, and bottom conductive electrode 607 is referred to herein as an asymmetric selector element.

In an embodiment, a plasma etch process is utilized to pattern the first electrode material layer 602 and the selector material layer 604. In an embodiment, the plasma etch process erodes over 50% of the uppermost electrode 614A to leave memory element 614 remaining. The memory element 614, top electrode 612, asymmetric selector layer 610, and bottom conductive electrode 607 may be referred to as an active memory device.

Figure 6E:
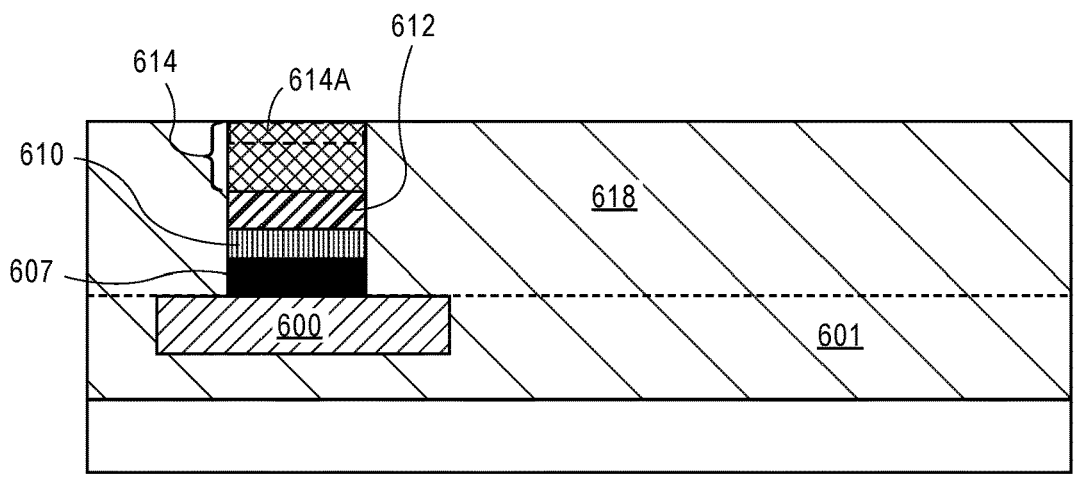

FIG. 6E illustrates the structure of FIG. 6D following the formation of a second dielectric layer 618 on the word line 600 and on the dielectric layer 601 and on the active memory device. In an embodiment, a second dielectric layer 618 is blanket deposited on the surface of the memory element 614, and on the sidewalls of the asymmetric selector element 612/610/607, on the word line 600, and on the dielectric layer 601. In an embodiment, the dielectric layer 618 includes an insulating material such as but not limited to silicon oxide, silicon carbide, carbon doped nitride and silicon nitride. In an embodiment, the second dielectric layer 618 is planarized. In an embodiment, the planarization process removes a portion of the uppermost electrode 614A. In an embodiment, the planarization process forms a second dielectric layer 618 having an uppermost surface that is co-planar or substantially coplanar with an uppermost surface of the memory element 614.

Figure 6F:
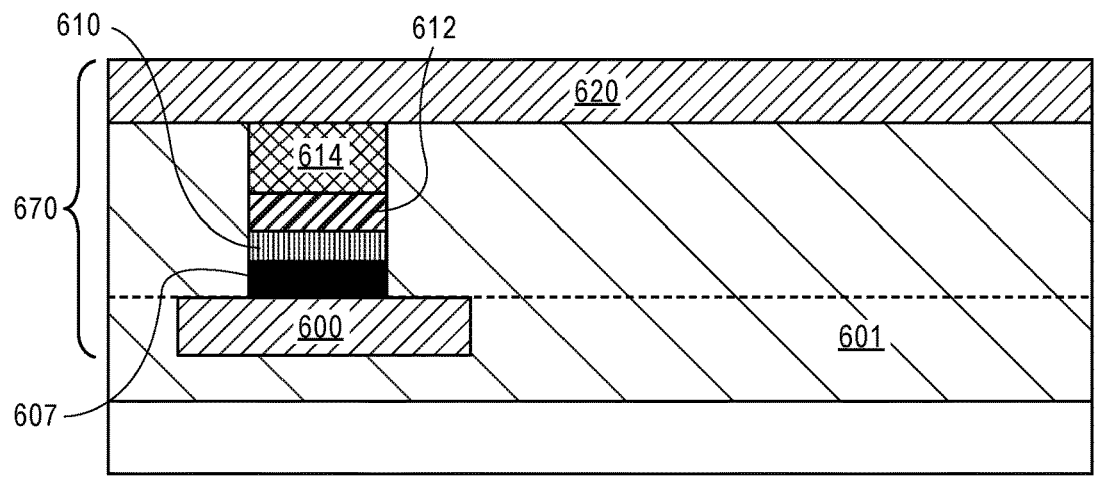

FIG. 6F illustrates a bit line 600 formed on the uppermost surface of the memory element 614 and on the uppermost surface of the second dielectric layer 618 to complete formation of a memory cell 670. In an embodiment, a layer of a conductive material is blanket deposited on the uppermost surface of the memory element 614 and on the uppermost surface of the second dielectric layer 618. The layer of a conductive material is then patterned to form a bit line 620. In an embodiment, the layer of a conductive material includes a material such as W, TiN, TaN or Ru. In an embodiment, the bit line 620 is formed by using a dual damascene process (not shown) and includes a barrier layer such as Ru, Ta or Ti and a fill metal such as W or Cu.

It is to be appreciated that the layers and materials described in association with embodiments herein are typically formed on or above an underlying semiconductor substrate, e.g., as FEOL layer(s). In other embodiments, the layers and materials described in association with embodiments herein are formed on or above underlying device layer(s) of an integrated circuit, e.g., as BEOL layer(s). In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, structures described herein may be fabricated on underlying lower level back end of line (BEOL) interconnect layers. For example, in one embodiment, an embedded non-volatile memory structure is formed on a material composed of a dielectric material such as, but not limited to, silicon dioxide, silicon oxy-nitride, silicon nitride, or carbon-doped silicon nitride. In a particular embodiment, an embedded non-volatile memory structure is formed on a low-k dielectric layer of an underlying BEOL layer.

In an embodiment, interconnect lines (and, possibly, underlying via structures) described herein are composed of one or more metal or metal-containing conductive structures. The conductive interconnect lines are also sometimes referred to in the art as traces, wires, lines, metal, interconnect lines or simply interconnects. In a particular embodiment, each of the interconnect lines includes a barrier layer and a conductive fill material. In an embodiment, the barrier layer is composed of a metal nitride material, such as tantalum nitride or titanium nitride. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

Interconnect lines described herein may be fabricated as a grating structure, where the term "grating" is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have conductive lines spaced at a constant pitch and having a constant width. The pattern may be fabricated by a pitch halving or pitch quartering, or other pitch division, approach.

In an embodiment, ILD materials described herein are composed of or include a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, patterning of trenches is achieved using lithographic operations performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

The integrated circuit structures described herein may be included in an electronic device. As an example of one such apparatus, FIGS. 7A and 7B are top views of a wafer and dies that include one or more embedded non-volatile memory structures having an asymmetric selector element, in accordance with one or more of the embodiments disclosed herein.

Figure 7B:
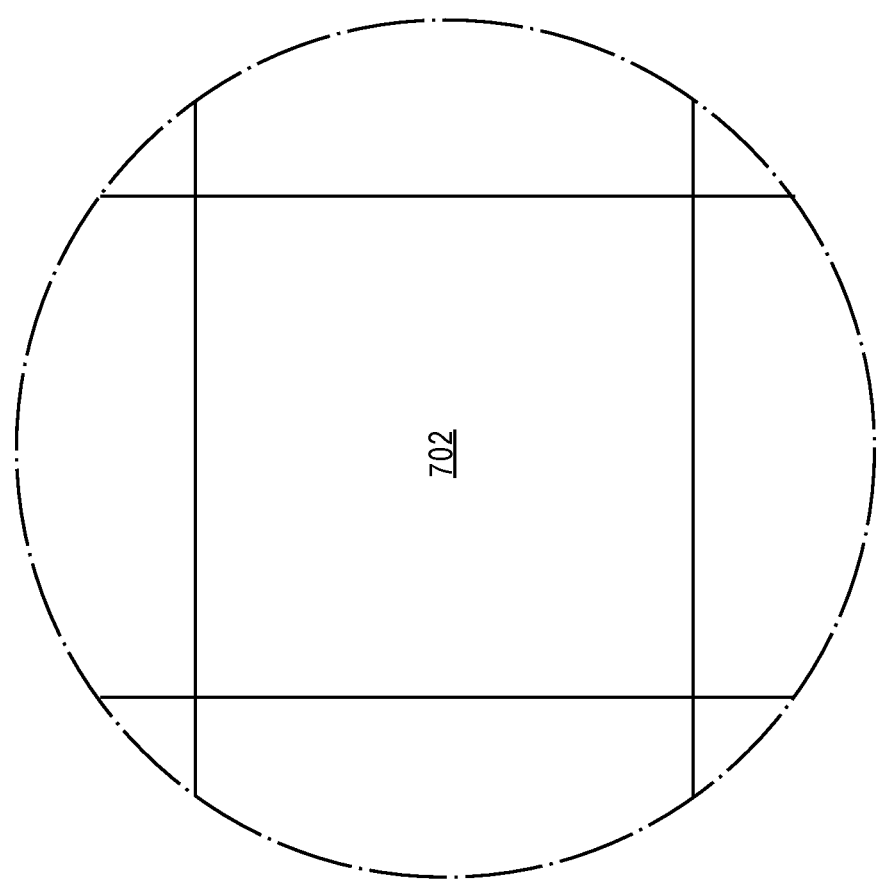
FIGS. 7A and 7B are top views of a wafer and dies that include one or more embedded non-volatile memory structures having an asymmetric selector element, in accordance with one or more of the embodiments disclosed herein.
Figure 7A:
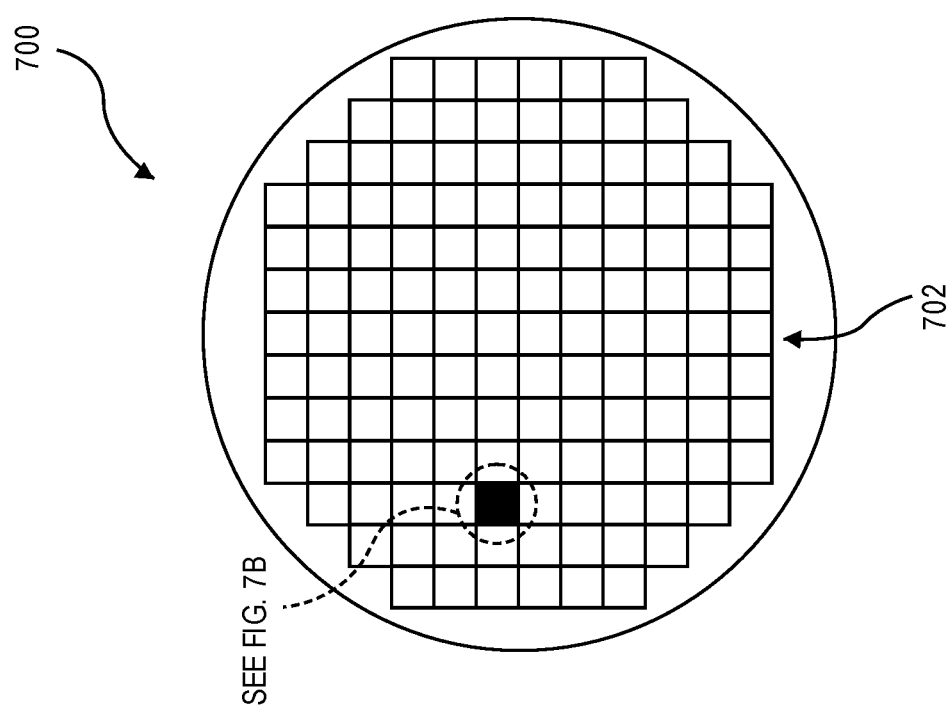

Referring to FIGS. 7A and 7B, a wafer 700 may be composed of semiconductor material and may include one or more dies 702 having integrated circuit (IC) structures formed on a surface of the wafer 700. Each of the dies 702 may be a repeating unit of a semiconductor product that includes any suitable IC (e.g., ICs including one or more embedded non-volatile memory structures having an asymmetric selector element, such as described above. After the fabrication of the semiconductor product is complete, the wafer 700 may undergo a singulation process in which each of the dies 702 is separated from one another to provide discrete "chips" of the semiconductor product. In particular, structures that include embedded non-volatile memory structures having an asymmetric selector element as disclosed herein may take the form of the wafer 700 (e.g., not singulated) or the form of the die 702 (e.g., singulated). The die 702 may include one or more embedded non-volatile memory structures based on asymmetric selector elements and/or supporting circuitry to route electrical signals, as well as any other IC components. In some embodiments, the wafer 700 or the die 702 may include an additional memory device (e.g., a static random access memory (SRAM) device), a logic device (e.g., an AND, OR, NAND, or NOR gate), or any other suitable circuit element. Multiple ones of these devices may be combined on a single die 702. For example, a memory array formed by multiple memory devices may be formed on a same die 702 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
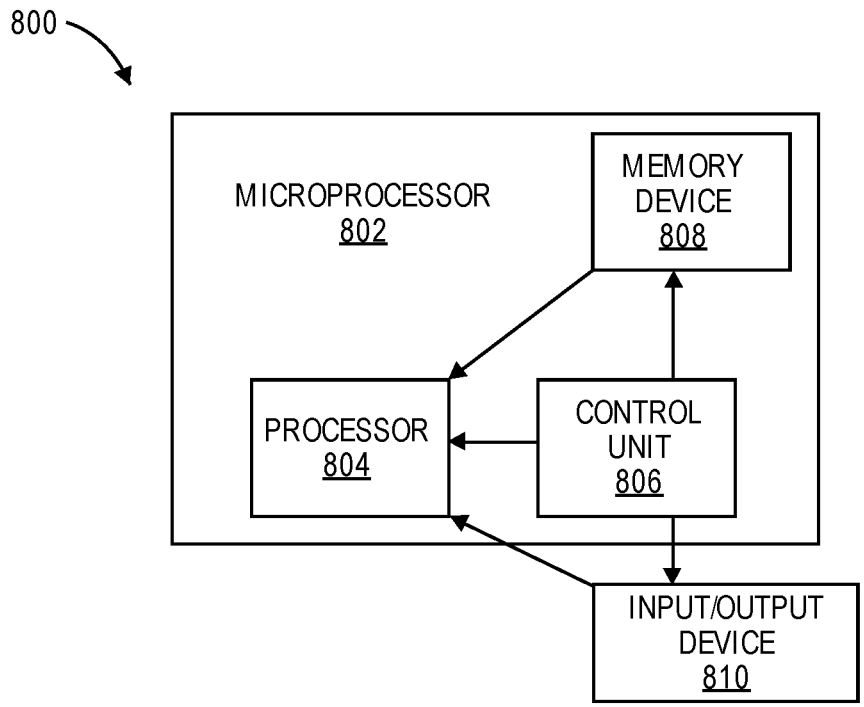
FIG. 8 illustrates a block diagram of an electronic system, in accordance with an embodiment of the present disclosure.

FIG. 8 illustrates a block diagram of an electronic system 800, in accordance with an embodiment of the present disclosure. The electronic system 800 can correspond to, for example, a portable system, a computer system, a process control system, or any other system that utilizes a processor and an associated memory. The electronic system 800 may include a microprocessor 802 (having a processor 804 and control unit 806), a memory device 808, and an input/output device 810 (it is to be appreciated that the electronic system 800 may have a plurality of processors, control units, memory device units and/or input/output devices in various embodiments). In one embodiment, the electronic system 800 has a set of instructions that define operations which are to be performed on data by the processor 804, as well as, other transactions between the processor 804, the memory device 808, and the input/output device 810. The control unit 806 coordinates the operations of the processor 804, the memory device 808 and the input/output device 810 by cycling through a set of operations that cause instructions to be retrieved from the memory device 808 and executed. The memory device 808 can include a non-volatile memory cell as described in the present description. In an embodiment, the memory device 808 is embedded in the microprocessor 802, as depicted in FIG. 8. In an embodiment, the processor 804, or another component of electronic system 800, includes one or more embedded non-volatile memory structures having an asymmetric selector element, such as those described herein.

Figure 9:
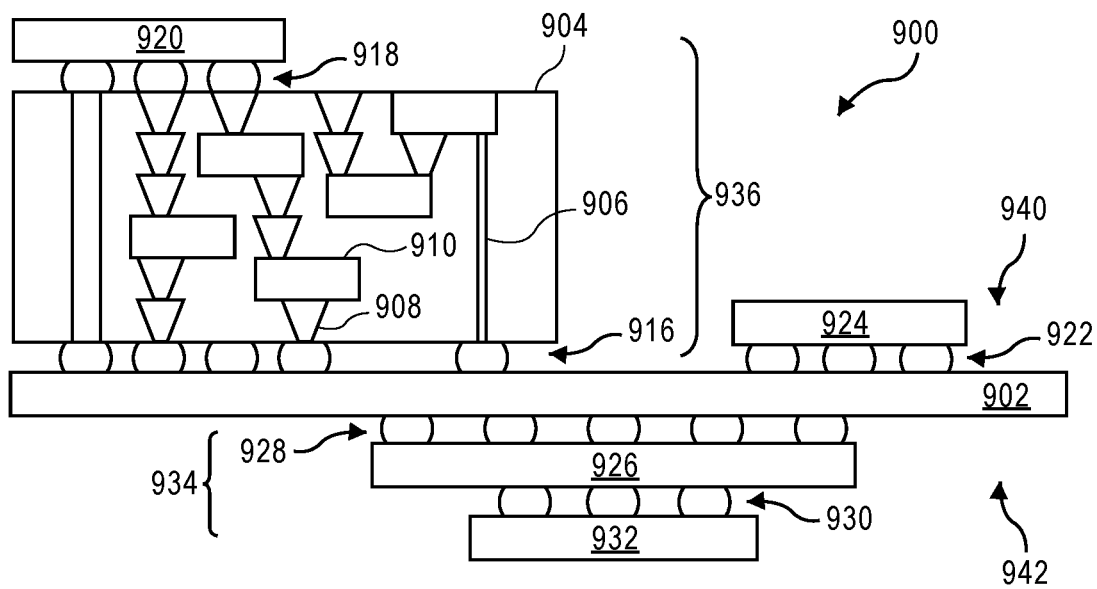
FIG. 9 is a cross-sectional side view of an integrated circuit (IC) device assembly that may include one or more embedded non-volatile memory structures having an asymmetric selector element, in accordance with one or more of the embodiments disclosed herein.

FIG. 9 is a cross-sectional side view of an integrated circuit (IC) device assembly that may include one or more embedded non-volatile memory structures having an asymmetric selector element, in accordance with one or more of the embodiments disclosed herein.

Referring to FIG. 9, an IC device assembly 900 includes components having one or more integrated circuit structures described herein. The IC device assembly 900 includes a number of components disposed on a circuit board 902 (which may be, e.g., a motherboard). The IC device assembly 900 includes components disposed on a first face 940 of the circuit board 902 and an opposing second face 942 of the circuit board 902. Generally, components may be disposed on one or both faces 940 and 942. In particular, any suitable ones of the components of the IC device assembly 900 may include a number of embedded non-volatile memory structures having an asymmetric selector element, such as disclosed herein.

In some embodiments, the circuit board 902 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 902. In other embodiments, the circuit board 902 may be a non-PCB substrate.

The IC device assembly 900 illustrated in FIG. 9 includes a package-on-interposer structure 936 coupled to the first face 940 of the circuit board 902 by coupling components 916. The coupling components 916 may electrically and mechanically couple the package-on-interposer structure 936 to the circuit board 902, and may include solder balls (as shown in FIG. 9), male and female portions of a socket, an adhesive, an underfill material, and/or any other suitable electrical and/or mechanical coupling structure.

The package-on-interposer structure 936 may include an IC package 920 coupled to an interposer 904 by coupling components 918. The coupling components 918 may take any suitable form for the application, such as the forms discussed above with reference to the coupling components 916. Although a single IC package 920 is shown in FIG. 9, multiple IC packages may be coupled to the interposer 904. It is to be appreciated that additional interposers may be coupled to the interposer 904. The interposer 904 may provide an intervening substrate used to bridge the circuit board 902 and the IC package 920. The IC package 920 may be or include, for example, a die (the die 702 of FIG. 7B), or any other suitable component. Generally, the interposer 904 may spread a connection to a wider pitch or reroute a connection to a different connection. For example, the interposer 904 may couple the IC package 920 (e.g., a die) to a ball grid array (BGA) of the coupling components 916 for coupling to the circuit board 902. In the embodiment illustrated in FIG. 9, the IC package 920 and the circuit board 902 are attached to opposing sides of the interposer 904. In other embodiments, the IC package 920 and the circuit board 902 may be attached to a same side of the interposer 904. In some embodiments, three or more components may be interconnected by way of the interposer 904.

The interposer 904 may be formed of an epoxy resin, a fiberglass-reinforced epoxy resin, a ceramic material, or a polymer material such as polyimide. In some implementations, the interposer 904 may be formed of alternate rigid or flexible materials that may include the same materials described above for use in a semiconductor substrate, such as silicon, germanium, and other group III-V and group IV materials. The interposer 904 may include metal interconnects 908 and vias 910, including but not limited to through-silicon vias (TSVs) 906. The interposer 904 may further include embedded devices 914, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 904. The package-on-interposer structure 936 may take the form of any of the package-on-interposer structures known in the art.

The IC device assembly 900 may include an IC package 924 coupled to the first face 940 of the circuit board 902 by coupling components 922. The coupling components 922 may take the form of any of the embodiments discussed above with reference to the coupling components 916, and the IC package 924 may take the form of any of the embodiments discussed above with reference to the IC package 920.

The IC device assembly 900 illustrated in FIG. 9 includes a package-on-package structure 934 coupled to the second face 942 of the circuit board 902 by coupling components 928. The package-on-package structure 934 may include an IC package 926 and an IC package 932 coupled together by coupling components 930 such that the IC package 926 is disposed between the circuit board 902 and the IC package 932. The coupling components 928 and 930 may take the form of any of the embodiments of the coupling components 916 discussed above, and the IC packages 926 and 932 may take the form of any of the embodiments of the IC package 920 discussed above. The package-on-package structure 934 may be configured in accordance with any of the package-on-package structures known in the art.

Figure 10:
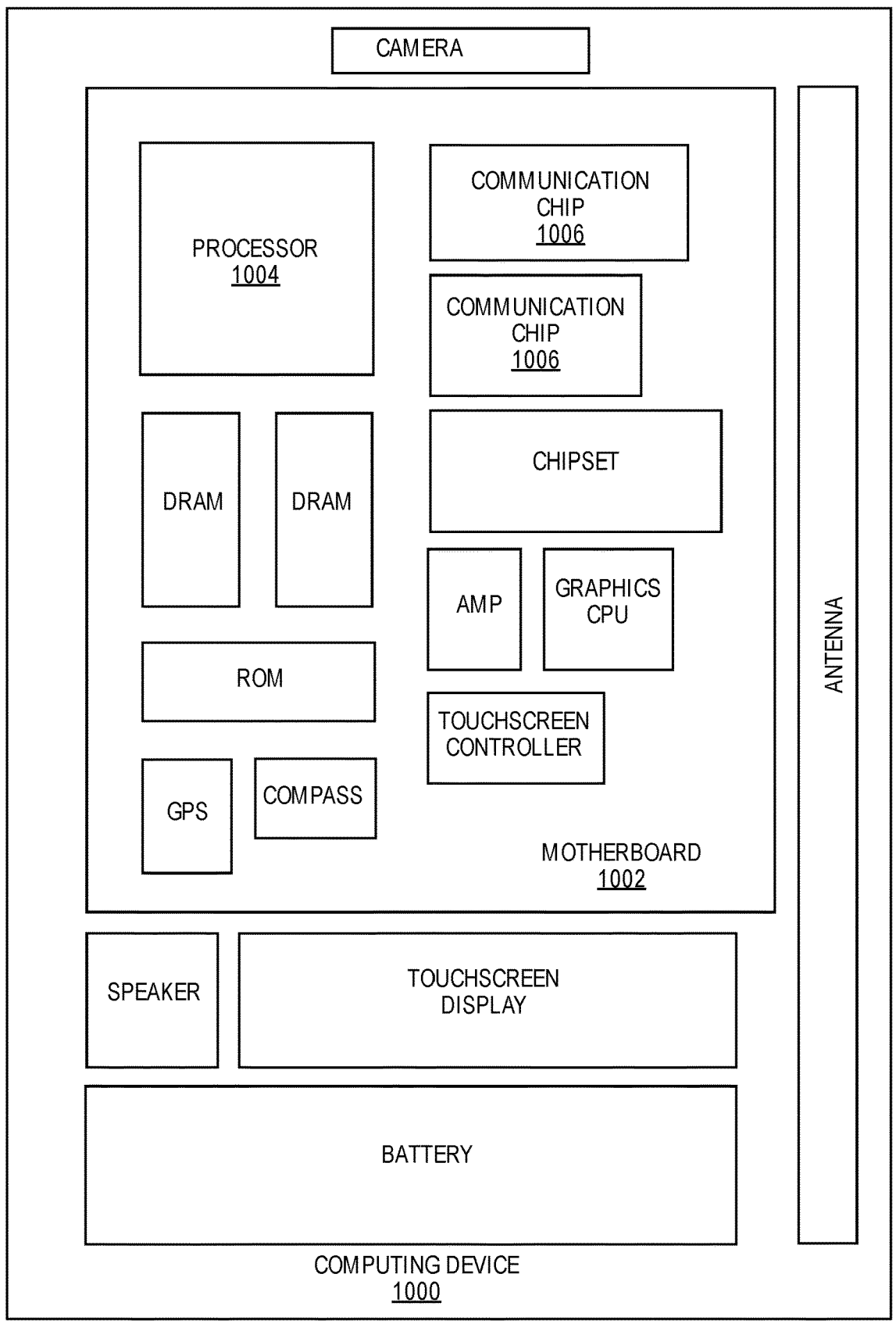
FIG. 10 illustrates a computing device in accordance with one implementation of an embodiment of the disclosure.

FIG. 10 illustrates a computing device 1000 in accordance with one implementation of the disclosure. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the disclosure, the integrated circuit die of the processor includes one or more embedded non-volatile memory structures having an asymmetric selector element, in accordance with implementations of embodiments of the disclosure. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of embodiments of the disclosure, the integrated circuit die of the communication chip includes one or more embedded non-volatile memory structures having an asymmetric selector element, in accordance with implementations of embodiments of the disclosure.

In further implementations, another component housed within the computing device 1000 may contain an integrated circuit die that includes one or more embedded non-volatile memory structures having an asymmetric selector element, in accordance with implementations of embodiments of the disclosure.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Thus, embodiments described herein include embedded non-volatile memory structures having asymmetric selector elements.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

A memory device includes a word line. An asymmetric selector element is above the word line. The asymmetric selector element includes a first electrode material layer, a selector material layer on the first electrode material layer, and a second electrode material layer on the selector material layer, the second electrode material layer different in composition than the first electrode material layer. A bipolar memory element is above the word line, the bipolar memory element on the asymmetric selector element. A bit line is above the word line.

Example Embodiment 2

The memory device of example embodiment 1, wherein one of the first electrode material layer or the second electrode material layer includes a metal selected from the group consisting of tungsten (W), platinum (Pt), ruthenium (Ru), and iridium (Ir).

Example Embodiment 3

The memory device of example embodiment 2, wherein the other of the first electrode material layer or the second electrode material layer includes copper telluride (CuTe) or copper germinide (CuGe).

Example Embodiment 4

The memory device of example embodiment 1, wherein one of the first electrode material layer or the second electrode material layer includes copper telluride (CuTe) or copper germinide (CuGe).

Example Embodiment 5

The memory device of example embodiment 1, 2, 3 or 4, wherein the selector material layer includes an electrolyte material.

Example Embodiment 6

The memory device of example embodiment 1, 2, 3 or 4, wherein the selector material layer includes a phase change material.

Example Embodiment 7

The memory device of example embodiment 1, 2, 3 or 4, wherein the selector material layer includes an insulator metal transition material.

Example Embodiment 8

The memory device of example embodiment 1, 2, 3 or 4, wherein the selector material layer includes a semiconducting oxide material.

Example Embodiment 9

The memory device of example embodiment 1, 2, 3, 4, 5, 6, 7 or 8, wherein the asymmetric selector element has a threshold voltage less than or equal to 1V.

Example Embodiment 10

The memory device of example embodiment 1, 2, 3, 4, 5, 6, 7, 8 or 9, wherein the asymmetric selector element is above the bipolar memory element.

Example Embodiment 11

The memory device of example embodiment 1, 2, 3, 4, 5, 6, 7, 8 or 9, wherein the asymmetric selector element is below the bipolar memory element.

Example Embodiment 12

The memory device of example embodiment 1, 2, 3, 4, 5, 6, 7, 8, 9, 10 or 11, wherein the bipolar memory element includes a resistive random access memory (RRAM) device.

Example Embodiment 13

The memory device of example embodiment 1, 2, 3, 4, 5, 6, 7, 8, 9, 10 or 11, wherein the bipolar memory element includes a magnetic tunnel junction (MTJ) device.

Example Embodiment 14

A memory structure includes a first bit line above a substrate, and a first memory cell on the first bit line. The first memory cell includes a first asymmetric selector element above the first bit line, the first asymmetric selector element including a first electrode material layer, a selector material layer on the first electrode material layer, and a second electrode material layer on the selector material layer, the second electrode material layer different in composition than the first electrode material layer. A first bipolar memory element is above the first bit line, the first bipolar memory element on the first asymmetric selector element. A word line is on the first memory cell. The memory structure also includes a second memory cell on the word line. The second memory cell includes a second asymmetric selector element above the word line, the second asymmetric selector element includes a first electrode material layer, a selector material layer on the first electrode material layer, and a second electrode material layer on the selector material layer, the second electrode material layer different in composition than the first electrode material layer. A second bipolar memory element is above the word line, the second bipolar memory element on the second asymmetric selector element. A second bit line is on the second memory cell.

Example Embodiment 15

The memory structure of example embodiment 14, wherein the first asymmetric selector element is above the first bipolar memory element, and the second asymmetric selector element is below the second bipolar memory element.

Example Embodiment 16

The memory structure of example embodiment 14, wherein the first asymmetric selector element is below the first bipolar memory element and the second asymmetric selector element is above the second bipolar memory element.

Example Embodiment 17

The memory structure of example embodiment 14, 15 or 16, wherein the first bipolar memory and the second bipolar memory element each include a resistive random access memory (RRAM) device, or each include a magnetic tunnel junction (MTJ) device.

Example Embodiment 18

A method of fabricating a memory device includes forming a bit line in a first dielectric layer above a substrate, and forming a selector material stack on the bit line. The selector material stack includes a first electrode material layer, and a selector material layer on the first electrode material layer. The method further includes forming a second electrode material layer on the selector material stack, the second electrode material layer different in composition than the first electrode material layer. The method also includes forming a bipolar memory material layer on the second electrode material layer, patterning the bipolar memory material layer stack, patterning the second electrode material layer to form a conductive electrode, forming an asymmetric selector element by using the conductive electrode to pattern the selector material stack, forming a second dielectric layer on the hardmask, on sidewalls of the asymmetric selector element and on sidewalls of the bipolar memory element, planarizing the second dielectric layer to expose an uppermost surface of the bipolar memory element, and forming a word line on the uppermost surface of the bipolar memory element and on an uppermost surface of the second dielectric layer.

Example Embodiment 19

The method of example embodiment 18, wherein forming the bipolar memory material layer stack includes forming a material layer stack for a resistive random access memory device.

Example Embodiment 20

The method of example embodiment 18, wherein forming the bipolar memory material layer stack includes forming a material layer stack for a magnetic tunnel junction device.

What is claimed is:

1. A memory device, comprising:
   a word line;
   an asymmetric selector element above the word line, the asymmetric selector element comprising a first electrode material layer, a selector material layer on the first electrode material layer, and a second electrode material layer on the selector material layer, second electrode material layer different in composition than the first electrode material layer;
   a bipolar memory element above the word line, the bipolar memory element on the asymmetric selector element; and
   a bit line above the word line.

2. The memory device of claim 1, wherein one of the first electrode material layer or the second electrode material layer comprises a metal selected from the group consisting of tungsten (W), platinum (Pt), ruthenium (Ru), and iridium (Ir).

3. The memory device of claim 2, wherein the other of the first electrode material layer or the second electrode material layer comprises copper telluride (CuTe) or copper germinide (CuGe).

4. The memory device of claim 1, wherein one of the first electrode material layer or the second electrode material layer comprises copper telluride (CuTe) or copper germinide (CuGe).

5. The memory device of claim 1, wherein the selector material layer comprises an electrolyte material.

6. The memory device of claim 1, wherein the selector material layer comprises a phase change material.

7. The memory device of claim 1, wherein the selector material layer comprises an insulator metal transition material.

8. The memory device of claim 1, wherein the selector material layer comprises a semiconducting oxide material.

9. The memory device of claim 1, wherein the asymmetric selector element has a threshold voltage less than or equal to 1V.

10. The memory device of claim 1, wherein the asymmetric selector element is above the bipolar memory element.

11. The memory device of claim 1, wherein the asymmetric selector element is below the bipolar memory element.

12. The memory device of claim 1, wherein the bipolar memory element comprises a resistive random access memory (RRAM) device.

13. The memory device of claim 1, wherein the bipolar memory element comprises a magnetic tunnel junction (MTJ) device.

14. A memory structure, comprising:
   a first bit line above a substrate;
   a first memory cell on the first bit line, the first memory cell comprising:
      a first asymmetric selector element above the word line, the first asymmetric selector element comprising a first electrode material layer, a selector material layer on the first electrode material layer, and a second electrode material layer on the selector material layer, the second electrode material layer different in composition than the first electrode material layer; and
      a first bipolar memory element above the first bit line, the first bipolar memory element on the first asymmetric selector element;
   a word line on the first memory cell; a second memory cell on the word line, the second memory cell comprising:
      a second asymmetric selector element above the word line, the second asymmetric selector element comprising a first electrode material layer, a selector material layer on the first electrode material layer, and a second electrode material layer on the selector material layer, the second electrode material layer different in composition than the first electrode material layer; and a second bipolar memory element above the word line, the second bipolar memory element on the second asymmetric selector element; and a second bit line on the second memory cell.

15. The memory structure of claim 14, wherein the first asymmetric selector element is above the first bipolar memory element, and the second asymmetric selector element is below the second bipolar memory element.

16. The memory structure of claim 14, wherein the first asymmetric selector element is below the first bipolar memory element and the second asymmetric selector element is above the second bipolar memory element.

17. The memory structure of claim 14, wherein the first bipolar memory and the second bipolar memory element each comprise a resistive random access memory (RRAM) device, or each comprise a magnetic tunnel junction (MTJ) device.

* * * * *